(12) United States Patent
Fronk

(10) Patent No.: US 7,200,011 B2
(45) Date of Patent: Apr. 3, 2007

(54) THERMAL INTERFACE ADAPTER PLATE CONVERSION KIT AND METHOD

(75) Inventor: Karl T. Fronk, Derry, NH (US)

(73) Assignee: Astec International Limited, Hong Kong (HK)

( * ) Notice: Subject to any disclaimer, the term of this patent is extended or adjusted under 35 U.S.C. 154(b) by 398 days.

(21) Appl. No.: 10/428,974

(22) Filed: May 2, 2003

(65) Prior Publication Data

US 2004/0218375 A1  Nov. 4, 2004

(51) Int. Cl.
*H05K 7/02* (2006.01)
*H05K 7/04* (2006.01)

(52) U.S. Cl. ............ 361/810; 361/719; 361/718; 361/792

(58) Field of Classification Search ........... 361/801, 361/719, 760, 720, 810, 718; 363/144
See application file for complete search history.

(56) References Cited

U.S. PATENT DOCUMENTS

| | | | | |
|---|---|---|---|---|
| 5,835,350 A | * | 11/1998 | Stevens | 361/704 |
| 5,933,343 A | * | 8/1999 | Lu et al. | 363/144 |
| 5,973,923 A | * | 10/1999 | Jitaru | 361/704 |
| 6,317,324 B1 | * | 11/2001 | Chen et al. | 361/704 |
| 6,459,586 B1 | | 10/2002 | Miller et al. | 361/719 |
| D465,199 S | * | 11/2002 | Tomioka | 361/717 |
| 6,578,260 B1 | * | 6/2003 | Dixon et al. | 29/830 |
| 6,643,135 B2 | * | 11/2003 | Tomioka | 361/719 |

\* cited by examiner

*Primary Examiner*—Tuan Dinh
*Assistant Examiner*—Hung S. Bui
(74) *Attorney, Agent, or Firm*—Nixon Peabody LLP

(57) ABSTRACT

A method of selectively assembling a printed circuit board (PCB) module intended for attachment to another structure, such as another larger PCB. A plurality of different mounting hardware for a PCB are provided for enabling the selective enhancement of the thermal characteristics of the module. One embodiment provides a conversion kit comprising a PCB having a circuit mounted thereon, lead frames, a baseplate, and open frame and baseplate mounting hardware that, when selectively attached to the PCB, result in an open frame or a baseplate module. The manufacturer of power conversion or other modules can thus manufacture and pretest the board's electronics before assembly into either an open frame or baseplate module, while also providing a conversion kit that includes inexpensive mounting hardware to enable a user to select between assembling a module as either an open frame or a baseplate module.

14 Claims, 5 Drawing Sheets

THERMAL INTERFACE ADAPTER PLATE CONVERSION KIT AND METHOD

FIELD OF THE INVENTION

The present invention relates to the assembly of electronic components on a printed circuit board, and in particular, to methods for configuring such boards to provide either an open frame or baseplate module for enabling heat to be conducted away from said board.

BACKGROUND OF THE INVENTION

Printed circuit boards (PCBs) are commonly assembled by soldering electronic components to conductive traces on the PCB. These components can range in complexity from individual passive elements, such as resistors, to integrated circuits, to other circuit boards having previously constructed subassemblies, such as power converter subassemblies. The layout of the electronic components is primarily dictated by electrical considerations and mechanical considerations, such as the size and shape of the elements. In addition, some elements can generate a substantial amount of heat that is not easily removed from the PCB. Thermal requirements thus also must be considered in order to maintain the PCB components within predefined temperature limits.

Power converters are used to transform power at one set of conditions to another, and are becoming more commonly used as a PCB mounted subassembly. For example, a PCB having low operating voltage components but high current demand may be provided power by the use of a board-mounted power converter module (PCM) that is provided power from a high voltage power source via relatively smaller gauge wires.

PCMs dissipate large amounts of electrical power for their size, and, as a result, cooling these subassemblies is an issue. Several different PCM configurations are currently being sold to accommodate different board layouts, cooling air availability, and temperature requirements. Two common PCM configurations are "baseplate" models and "open-frame" models. In the baseplate model, a metal plate covers one surface of the PCB and acts as a heat sink for removing the heat generated by the components mounted on the PCB. A cooling air flow removes the heat from the baseplate/heat sink. In the open frame model, the cooling air flows directly across the PCB. No additional baseplate/heat sink is used. These models are different enough to preclude an economical module that is universally adaptable for use in different mounting configurations. As such, it is common for PCM manufacturers to produce PCMs having the same electronics but with different physical structures to accommodate different mounting configurations. This allows PCM manufacturers to develop a range of products to meet different electrical requirements, and allows the PCM purchaser the ability to separately select PCMs having different power conditioning requirements and mounting requirements.

For PCM manufacturers that attempt to meet the demands of a large number of customers, the common usage of different mounting configurations is problematic. Specifically, manufacturers are required to stock a large number of nearly identical electrical components. The need to stock multiple, non-interchangeable models is inconvenient and can be expensive for the subassembly manufacturers, and can make it difficult to keep the necessary stock on hand.

What is needed is an improved method of manufacturing electronic subassemblies having different mounting fixtures. The method should allow the manufacturer to maintain stocks of preassembled and pretested electronic assemblies and the ability to ship products to customers as they are needed. The resulting method should be compatible with manufacturing techniques and give the end user the ability to select between different mounting options.

SUMMARY OF THE INVENTION

The present invention solves the above-identified problems of providing subassemblies for mounting on a PCB. In particular, a subassembly, or module, is provided that allows a user to select one of a plurality of mounting fixtures or hardware. As a particular example, and one that is not meant to limit the scope of the present invention, a subassembly PCB having an electric circuit thereon is provided with mounting fixtures that enable the assembly of a module as either an open frame module or a baseplate module for mounting on another PCB or the like. Further, it is within the scope of the present invention to provide a subassembly having other mounting configurations.

It is one aspect of the present invention to provide a method of selectively assembling as either an open frame module or a baseplate module from a PCB and mounting fixtures. The method includes the steps of selecting a desired PCB and associated circuit, determining whether the type of module to be assembled is to be an open frame module or a baseplate module, selecting mounting fixtures according to the type of module selected, and attaching the selected mounting fixtures to the selected PCB.

The mounting fixtures for the open frame module include at least one lead frame including snap fit fasteners. The PCB includes holes that enable the fasteners on each lead frame to be snap fit in the holes, such that each lead frame is securely fastened onto the PCB.

The mounting fixtures for the baseplate module include a baseplate having a plurality of posts extending out from the surface thereof and positioned to fit through corresponding holes in the PCB, at least one lead frame having holes formed therein, such that at least some of the posts are also enabled to extend therethrough, and a plurality of fasteners. When the module is assembled using these fasteners, the PCB and at least one lead frame are clamped in place between the baseplate and the fasteners. The baseplate may include a plurality of pretapped holes positioned to mate during assembly with the fasteners that extend through corresponding holes in the PCB and lead frames.

In a preferred embodiment, the PCB circuit is a power converter. The inventive method thus allows a user to select from among a plurality of mounting configurations for use with a single power converter board.

According to another aspect of the present invention, a conversion kit is provided for enabling a user to select between assembling a module as either an open frame module or a baseplate module. The kit includes a printed circuit board (PCB) including an electrical circuit having one or more components mounted on a first surface thereof and having two rows of pins extending out from the first surface proximate to opposite edges of said PCB, for enabling the circuit to be connected to a circuit external to the PCB. One or more components of said circuit may also be mounted on the opposite surface of the PCB. The kit also includes two non-conductive lead frames each having a plurality of holes in a position to enable each lead frame to be positioned on the surface of the PCB with each pin extending through a corresponding hole in one of the lead frames. Lastly, the kit provides for the use of either open frame mounting hardware for mounting said lead frames to the PCB, or a baseplate and baseplate mounting hardware for attaching said baseplate to the opposite surface of the PCB, said mounting hardware providing selective heat dissipation alternatives for the circuit components and for attaching the lead frames to the PCB.

A further understanding of the invention can be had from the detailed discussion of the specific embodiment below. For purposes of clarity, this discussion refers to devices, methods, and concepts in terms of specific examples. It is intended that the invention is not limited by the discussion of specific embodiments.

BRIEF DESCRIPTION OF THE DRAWING

The foregoing aspects and the attendant advantages of the present invention will become more readily apparent by reference to the following detailed description, when taken in conjunction with the accompanying drawings, wherein.

Reference symbols are used in the Figures to indicate certain components, aspects or features shown therein, with reference symbols common to more than one Figure indicating like components, aspects or features shown therein.

DETAILED DESCRIPTION OF THE INVENTION

To facilitate its description, the invention is described below in terms of a power conversion module configured to accept mounting fixtures for enabling the module to be mounted as an open frame module or a baseplate module to another structure, such as a PCB motherboard.

Figure 5:
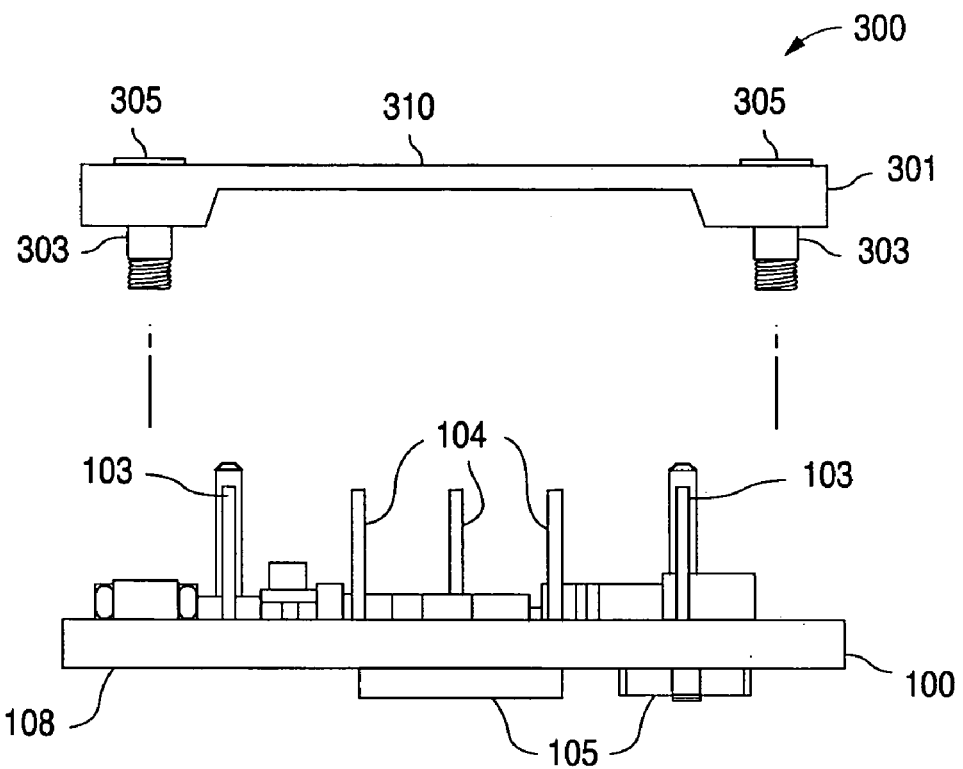
FIG. 5 is a side assembly view of the open frame module according to the present invention.
Figure 7:
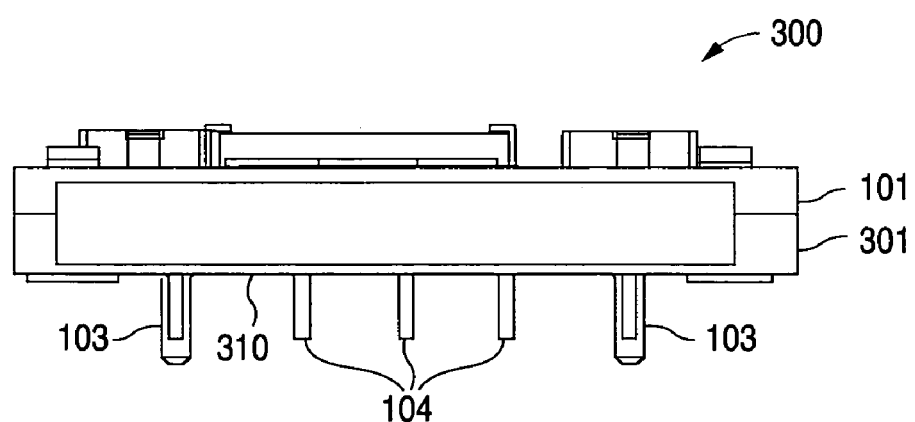
FIG. 7 is a side view of the open frame module of FIG. 5.
Figure 6:
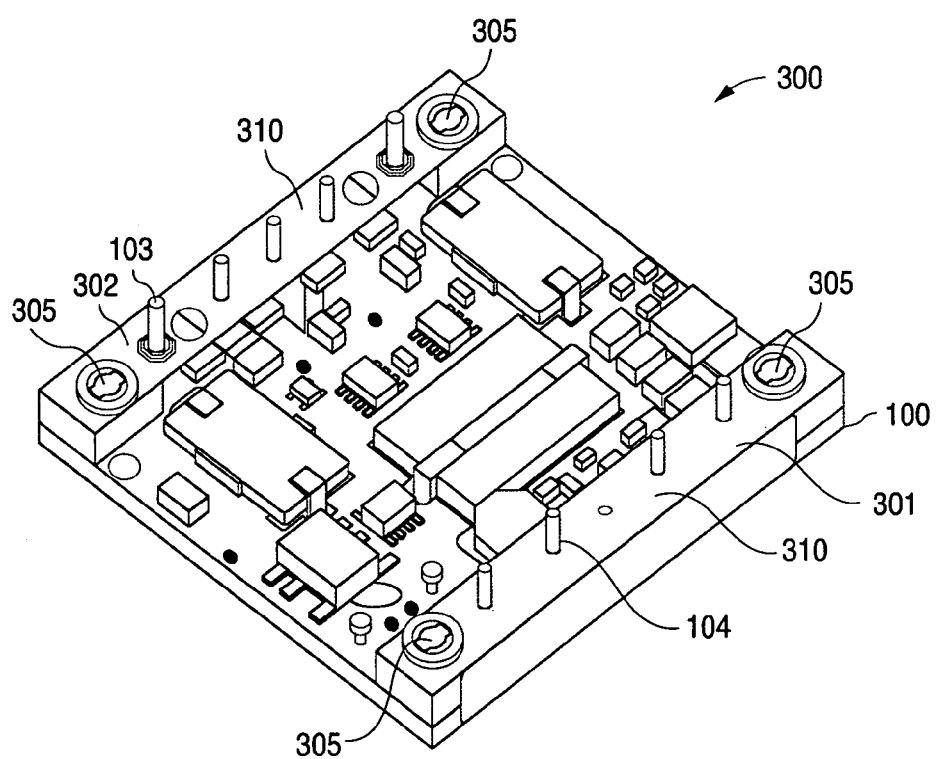
FIG. 6 is a perspective view of the open frame module of FIG. 5.

The present invention will now be described in more detail with reference to the Figures. The present invention is directed at methods for providing flexibility in power converter module manufacturing by having a PCB that can easily accept mounting fixtures that enable the PCB to be assembled as either a baseplate module or an open frame module. According to the present invention, FIGS. 1–4 are several views of a baseplate module 200 constructed using selected mounting fixtures, while FIGS. 5–7 are several views of an open frame module 300 also constructed using selected mounting fixtures. Each of these assemblies preferably includes a power converter circuit on a PCB 100. As is most clearly shown in FIGS. 1 and 2, PCB 100 has an electric circuit thereon including a plurality of electronic components 105 mounted on each side of PCB 100. A plurality of pins, including power pins 103 and signal pins 104 extend out from a first surface 106 of PCB 100 to provide electrical connections to an external circuit. As described below, PCB 100 is configured to accept fixtures that enable the assembled module to be mounted on another structure, e.g., another, typically larger PCB (not shown), in various configurations.

Figure 1:
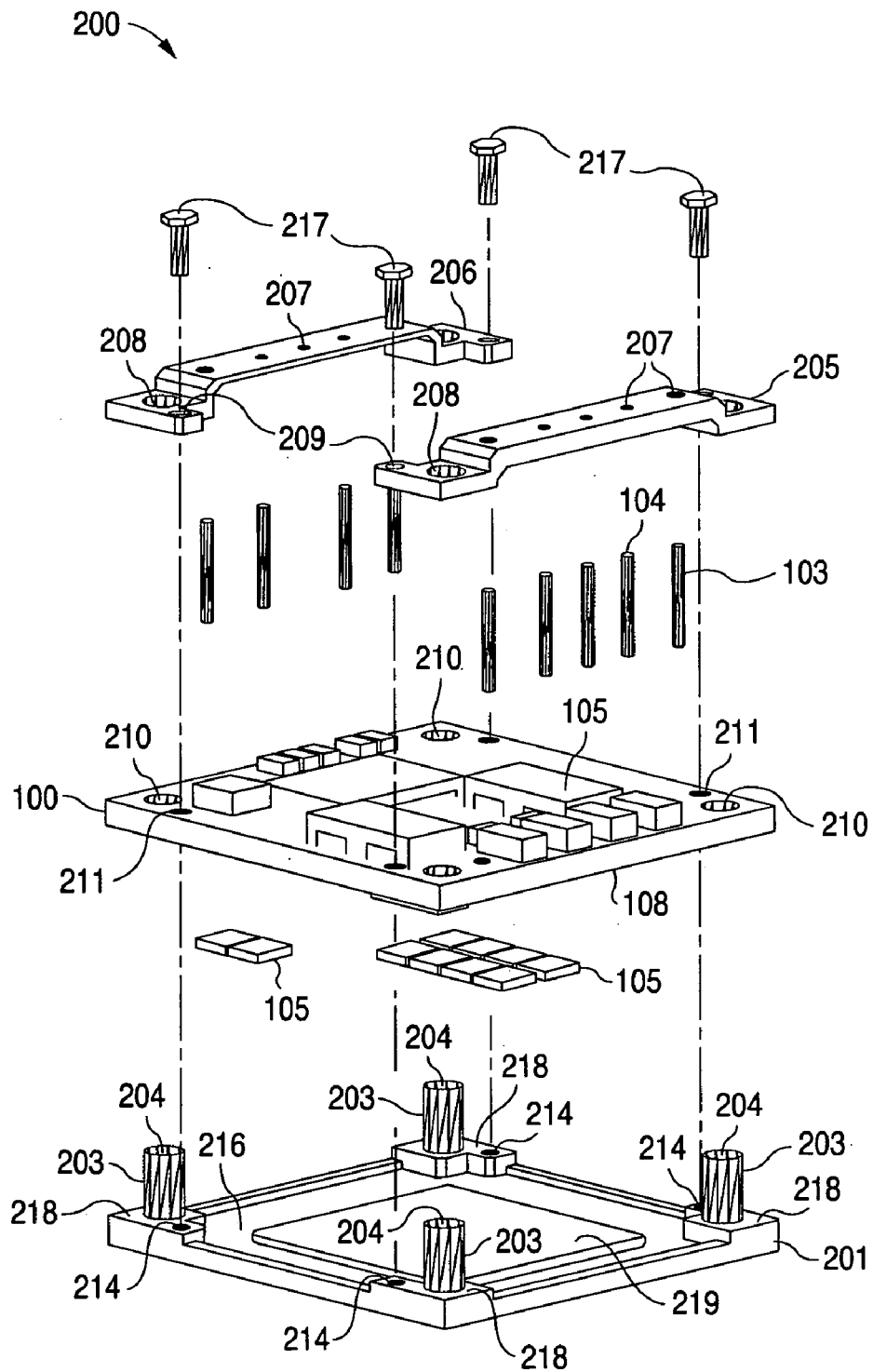
FIG. 1 is a perspective assembly view of a baseplate module according to the present invention.
Figure 2:
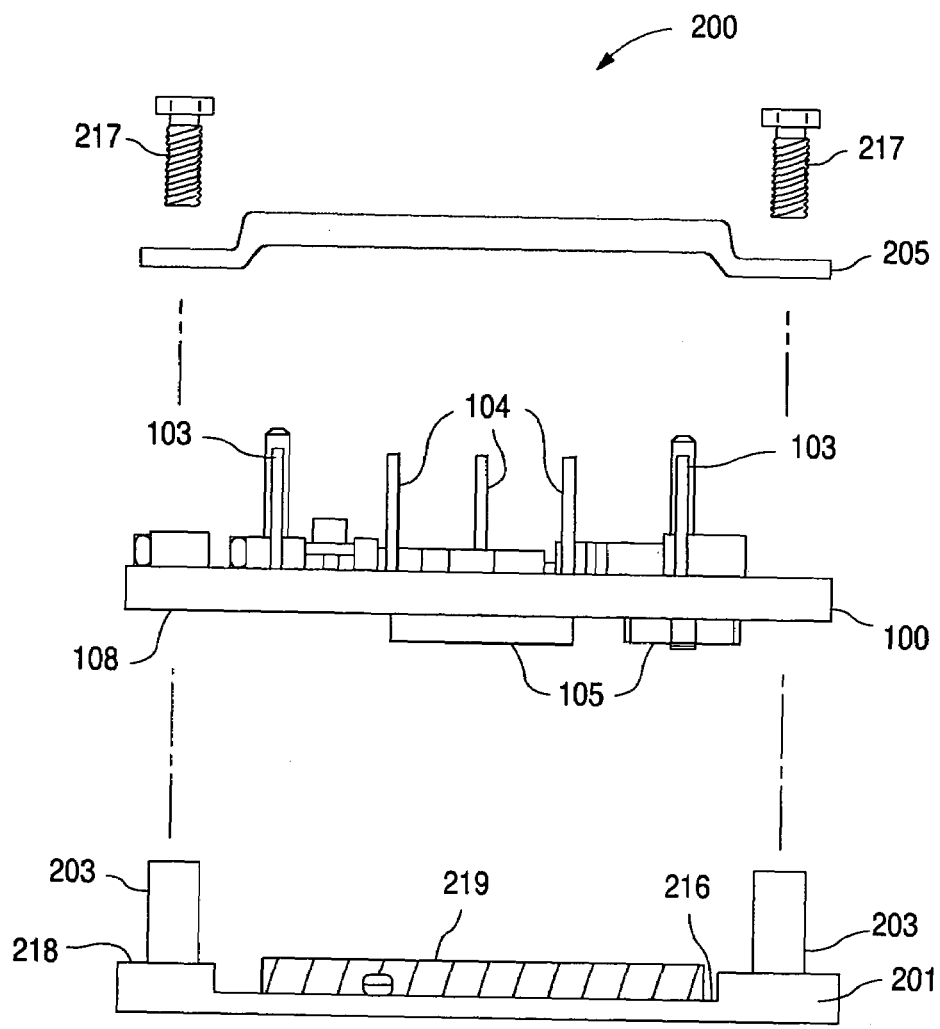
FIG. 2 is a side assembly view of the baseplate module of FIG. 1.
Figure 4:
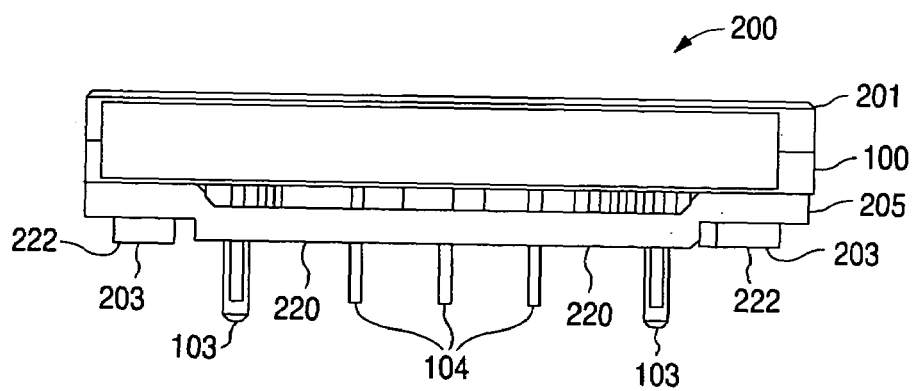
FIG. 4 is a side view of the baseplate module.
Figure 3:
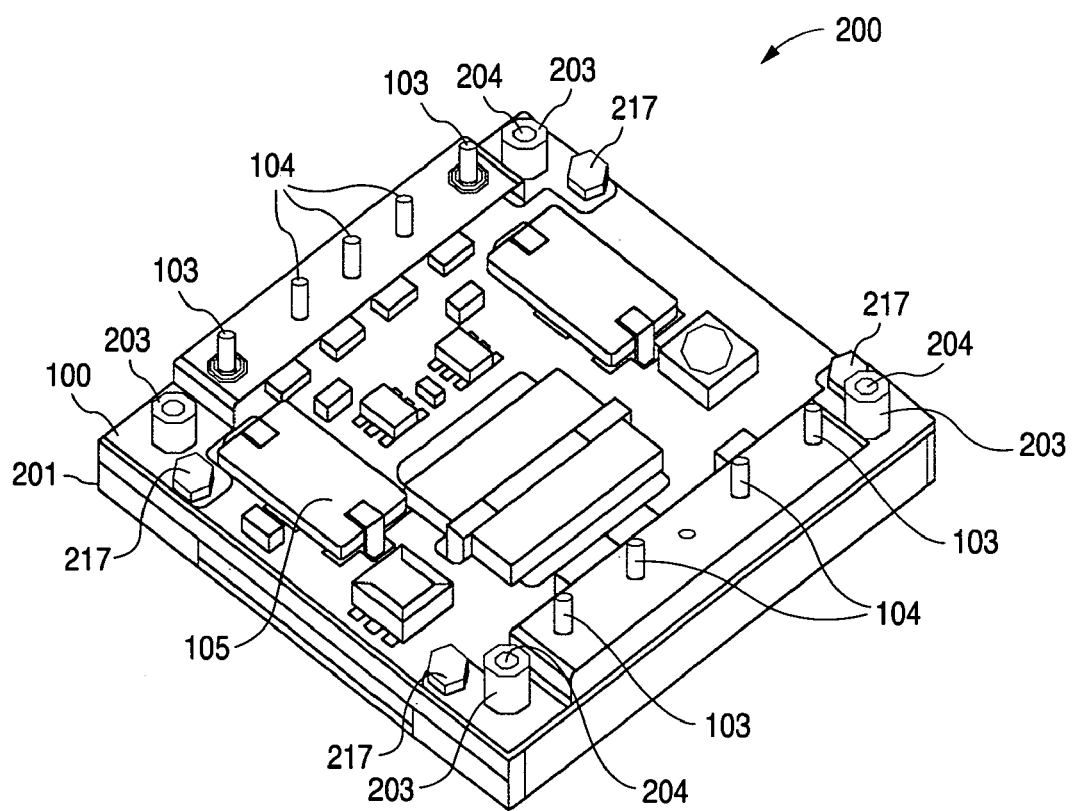
FIG. 3 is a perspective view of the baseplate module of FIG. 1.

More specifically, FIGS. 1–4 provide several views of baseplate module 200, where FIG. 1 is a perspective assembly view of the baseplate module, FIG. 2 is a side assembly view of the baseplate module, FIG. 3 is a perspective view of the baseplate module, and FIG. 4 is a side view of the baseplate module. Baseplate module 200 is formed from the attachment of mounting fixtures (hardware) including a baseplate 201 to PCB 100. Baseplate 201 includes a plurality of posts 203 that are preferable positioned at the four corners of baseplate 201. The mounting fixtures for baseplate module 200 also include at least one non-conductive lead frame or rail that is preferably made of plastic. In a preferred embodiment, two lead frames are included in the assembly, including a first lead frame 205 and a second lead frame 206. Lead frames 205,206 include holes 207 for enabling pins 103,104 to extend therethrough, holes 208 for enabling posts 203 to extend therethrough, and holes 209 for enabling fasteners 217 to extend therethrough. Corresponding holes are formed in PCB 100 at 210 and 211. As is seen, lead frames 205,206 are designed to distribute the force of the fasteners 217 that is applied to PCB 100 when baseplate module 200 is assembled. Baseplate 201 includes pre-tapped holes 214 positioned to enable automatic insertion of fasteners 217 during assembly of baseplate module 200. In a preferred embodiment, fasteners 217 are self-tapping stick-screws.

To enhance the removal of heat from the electrical components 105 on the bottom surface 108 of PCB 100, raised platforms 218 are preferably formed on the adjacent surface 216 of baseplate 201 to provide an interface between baseplate 201 and PCB 100. These raised islands help spread the heat over the baseplate 201 surface and minimize the thermal distance between the power components 105 on PCB 100 and the baseplate, which acts as a heat sink for module 200. Preferably, a small amount of automatically dispensed thermal compound, shown at 219, is then used during assembly of module 200 to fill the gap between the baseplate 201 and components 105 to further enhance thermal coupling of heat from components 105 and baseplate 201. Cooling airflow is typically used to remove heat from baseplate 201 once module 200 is mounted on another structure, although other techniques are known in the art for removing heat from such a heat sink.

As best seen in FIGS. 3 and 4, baseplate module 200 is assembled using fasteners 217 to securely clamp PCB 100, baseplate 201 and lead frames 205,206 together. Posts 203 enable the easy and secure mounting of PCB 100 and lead frames thereon during assembly. To aid in the automatic assembly of baseplate module 200, posts 203 may also be threaded in a way known in the art to enhance the secure mounting of the lead frame 205, 206 and PCB 100 to baseplate 201.

As shown in FIG. 4, the assembled baseplate module 200 has a plurality of pins 103, 104 that extend beyond the surface 220 of lead frames 205, 206 and the ends 222 of posts 203. Thus assembled, baseplate module 200 is mounted with surface 220 and ends 222 preferably defining a common plane that is designed to abut the surface of a structure on which the baseplate module 200 is to be installed. It is also envisioned, depending on the application, that either the posts 203 or the surface 220 of lead frames 205, 206 could provide this mechanical spacing function. It is anticipated that the structure to which the module 200 (and the open frame module 300) will be mounted will be a larger PCB (not shown). Preferably, the centers of posts 203 are pre-tapped, as shown at 204 in FIGS. 1 and 3, to enable the user to fasten module 200 onto the larger PCB using appropriately sized fasteners. When installed on the larger PCB, pins 103,104 of module 200 preferably extend into holes formed in this larger PCB to enable conventional automatic reflow soldering of the pins 103, 104 of module 200 (or 300) to corresponding holes formed in the larger PCB. Posts 203 may also be pre-tapped on the baseplate side of module 200 to enable a heatsink to be fastened to the baseplate 201.

FIGS. 5–7 are several views of open frame module 300, where FIG. 5 is a side assembly view of the open frame module 300, FIG. 6 is a perspective view of the open frame module 300, and FIG. 7 is a side view of the open frame module 300. Open frame module 300 is formed from the attachment of open frame fixtures to PCB 100. The mounting hardware for open frame module 300 includes at least one non-conductive lead frame 301 that is preferably made of plastic. In a preferred embodiment, two lead frames are included in the assembly, including a first lead frame 301 and a second lead frame 302. Lead frames 301,302 include holes 311 for enabling pins 103, 104 to extend therethrough. Each lead frame 301, 302 includes fasteners for fastening the lead frames to PCB 100. Preferably, these fasteners comprise snap fit fasteners 303 that enable automatic machinery to fasten the lead frames to PCB 100 by press fitting the lead frame fasteners into corresponding holes 210 (as best seen in FIG. 1) in each corner of PCB 100. As seen in FIG. 6, the sides of each lead frame 301, 302 that are opposite to each fastener 303 preferably include pre-tapped holes 305 for enabling module open frame module 300 to be secured to another, typically larger PCB (not shown).

The open frame module 300 provides excellent cooling of electrical components without the addition of a heat sink, since in typical configurations, cooling air flows directly across the PCB's electrical components 105.

In the open frame module 300 embodiment, the top surface 310 of lead frames 301,302 provide the proper standoff height for the module when it is later mounted on another PCB in the same fashion as described above for baseplate module 200. That is, as shown in FIG. 7, the assembled open frame module 300 has a plurality of pins 103,104 that extend beyond lead frames 301,302. Thus assembled, open frame module 300 is mounted with the surface 310 of lead frames 301, 302 abutting the surface of a larger PCB (not shown) to which module 300 is mounted by means of fasteners secured in the pre-tapped holes 305 of lead frames 301, 302, with pins 103,104 protruding into holes in the larger PCB for enabling automatic reflow soldering of pins 103, 104 to this other PCB.

The modules described above include a PCB 100 and open frame fixtures 301, 302 or baseplate fixtures 201, 205, and 217. The manufacturer can thus assemble and test PCB's containing circuits of interest, e.g., power converters, and stock hardware appropriate to the type of module the user requires. The manufacturer can either assemble a particular module prior to shipping, or can ship the PCB's along with one set of open frame fixtures and one set of baseplate fixtures, to enable the end user to easily assemble the module of choice.

The invention has now been explained with regard to specific embodiments. Variations on these embodiments and other embodiments may be apparent to those of skill in the art. It is therefore intended that the invention not be limited by the discussion of specific embodiments. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of selectively assembling a module as either an open frame module or a baseplate module from a conversion kit including a printed circuit board (PCB) having an electric circuit thereon and a first surface and an opposite surface and having at least one row of pins extending out from said first surface proximate to an edge of said PCB for enabling said circuit to be connected to a circuit external to said PCB; at least one non-conductive lead frame having a plurality of holes in a position to enable said lead frame to be positioned on the first surface of said PCB with each said pin extending through a corresponding hole in said lead frame; open frame mounting hardware; baseplate mounting hardware; and a baseplate, said method comprising:

selecting said PCB;

selecting mounting hardware according to what type of module is desired, wherein said open frame mounting hardware is for assembling said open frame module and said baseplate mounting hardware is for assembling said baseplate module;

attaching said at least one lead frame to said selected PCB using said selected mounting hardware; and attaching said baseplate to said opposite surface of said selected PCB if said desired type of module is said baseplate module.

2. The method of claim 1, wherein said PCB circuit is a power converter.

3. The method of claim 1, wherein said mounting hardware for said open frame module includes said at least one lead frame including snap fit fasteners, and wherein said PCB includes holes formed in said first surface thereof, for enabling the fasteners on said lead frame to be snap fit in said holes such that said lead frame is fastened onto said first surface of said PCB.

4. The method of claim 1, wherein said PCB includes a plurality of holes formed therein, and wherein said mounting hardware for said baseplate module includes said baseplate having a plurality of posts extending out from the surface thereof, sized and positioned to fit through said PCB holes, and a plurality of fasteners;

wherein said posts, said corresponding holes in said PCB, said at least one lead frame and said holes formed therein are all sized such that at least some of said posts are also enabled to extend through said holes in said at least one lead frame, such that, when assembled using said fasteners, said PCB and said at least one lead frame are clamped in place between said baseplate and said fasteners.

5. The method of claim 1, wherein said baseplate includes a plurality of pre-tapped holes; and wherein said PCB and said at least one lead frame define additional holes that enable said fasteners to extend therethrough during assembly and mate with said pre-tapped holes to provide said clamping.

6. A conversion kit for enabling a user to select between assembling a module as either an open frame module or a baseplate module, said kit comprising:

a printed circuit board (PCB) including an electrical circuit having one or more components mounted on a first surface thereof and having two rows of pins extending out from said first surface proximate to opposite edges of said PCB for enabling said circuit to be connected to a circuit external to said PCB, and including one or more components of said circuit mounted on the opposite surface of said PCB;

two non-conductive lead frames each having a plurality of holes in a position to enable each lead frame to be positioned on the surface of said PCB with each said pin extending through a corresponding hole in one of said lead frames; and providing a) open frame mounting hardware for attaching said lead frames to said PCB, and b) baseplate mounting hardware for attaching a baseplate to said opposite surface of said PCB and for attaching said lead frames to the PCB;

wherein said open frame mounting hardware, said baseplate, and said baseplate mounting hardware are provided for enabling user selection for assembling either said open frame module or said baseplate module so as to provide user-selectable heat dissipation alternatives for said circuit components and for attaching said lead frames to said PCB.

7. The kit of claim 6, wherein said PCB includes holes formed at each corner thereof, and wherein said open frame mounting hardware comprises means for enabling said lead frames to be snap fit in holes formed in the surface of said PCB.

8. The kit of claim 6, wherein said PCB includes holes formed at each corner thereof; wherein said baseplate mounting hardware comprises posts positioned at each corner of said baseplate and sized for fitting through said PCB holes and a plurality of fasteners; and wherein said lead frames include holes formed in each end thereof; and wherein said posts, said corresponding holes in said PCB, said lead frames and said holes formed in each end of said lead frames are all sized such that two of said posts are also enabled to extend through each said lead frame, and such that, when assembled using said fasteners, said PCB and said lead frames are clamped in place between said baseplate and said fasteners.

9. The kit of claim 8, wherein said baseplate includes a plurality of pre-tapped holes; and wherein said PCB and said lead frames include additional holes formed therein to enable said fasteners to extend through said holes during assembly and mate with said pre-tapped holes to provide said clamping.

10. The kit of claim 8, wherein said posts are sized such that, when said baseplate is mounted on said PCB, said posts provide a predetermined amount of spacing between said first surface of said PCB and the surface of a structure on which the assembled PCB is to be installed.

11. The kit of claim 10, wherein said posts are pre-tapped to enable fasteners to secure said PCB to the surface of said structure.

12. The kit of claim 6, wherein said lead frames are sized such that, when said lead frames are mounted on said PCB, said lead frames provide a predetermined amount of spacing between said first surface of said PCB and the surface of a structure on which the assembled PCB is to be installed.

13. The kit of claim 12, wherein said lead frames include pre-tapped holes to enable fasteners to secure said PCB to the surface of a structure on which the assembled PCB is to be installed.

14. The kit of claim 6, wherein said PCB circuit is a power converter, and wherein said one or more components on the opposite side of said PCB comprise power components.

* * * * *